United States Patent [19]

White et al.

[11] Patent Number: 5,600,261

[45] Date of Patent: Feb. 4, 1997

[54] OUTPUT ENABLE ACCESS FOR AN OUTPUT BUFFER

[75] Inventors: Allen R. White, Starkville, Miss.; Shiva P. Gowni, New Delhi, India

[73] Assignee: Cypress Semiconductor Corporation, San Jose, Calif.

[21] Appl. No.: 318,146

[22] Filed: Oct. 5, 1994

[51] Int. Cl.⁶ .................................................. H03K 17/16
[52] U.S. Cl. .................................. 326/27; 326/58; 326/88
[58] Field of Search ...................... 326/56–58, 109–110, 326/27, 88

[56] References Cited

U.S. PATENT DOCUMENTS

| | | | |
|---|---|---|---|
| 4,703,203 | 10/1987 | Gallup | 326/58 |
| 4,818,901 | 5/1989 | Young | 326/27 |
| 5,047,669 | 9/1991 | Iwamura | 326/58 |
| 5,081,374 | 1/1992 | Davis | 326/58 |
| 5,151,621 | 9/1992 | Goto | 326/58 |
| 5,329,186 | 7/1994 | Hush et al. | 326/88 |
| 5,367,205 | 11/1994 | Powell | 326/27 |
| 5,381,059 | 1/1995 | Douglas | 326/58 |

*Primary Examiner*—Edward P. Westin
*Assistant Examiner*—Andrew Sanders
*Attorney, Agent, or Firm*—Blakely, Sokoloff, Taylor & Zafman

[57] ABSTRACT

The generation of a controlled voltage signal as a buffer control signal for an output driver provides for relatively less delay for a high output enable access for an output buffer. As the output buffer undergoes the transition from a deselected state to a selected state to generate an output signal corresponding to a high input signal, a first voltage level is generated at a node and output as the control signal for the output driver, providing for an initial pull-up transition for the output signal. A second voltage level is subsequently generated at the node and output as the control signal for the output driver, providing for a steady-state voltage level for the high output signal.

13 Claims, 5 Drawing Sheets

5,600,261

OUTPUT ENABLE ACCESS FOR AN OUTPUT BUFFER

RELATED APPLICATIONS

The present patent application is related to U.S. Pat. No. 5,534,806, by Shiva P. Gowni Allen R. White, entitled "PULL-DOWN ACCESS FOR AN OUTPUT BUFFER," filed on the same filing date as the present patent application, and assigned to the assignee of the present patent application.

BACKGROUND OF THE INVENTION

1. Field of the Invention:

The present invention relates generally to the field of electrical devices. More particularly, the present invention relates to the field of output buffers.

2. Description of the Related Art:

With increased use and complexity of digital data processing systems, the speed at which digital data processing systems are able to perform various tasks has become more and more important.

One type of digital device that may limit the performance of digital data processing systems is output buffers. Output buffers are typically employed in digital data processing systems to drive addresses, data, or control signals, for example, over bus lines that couple various digital components, such as a microprocessor, various storage or memory devices, controllers, etc.

For each bit to be outputted over the bus lines, a typical output buffer uses pull-up circuitry or pull-down circuitry to drive either a logical-one or high signal or a logical-zero or low signal, respectively, over a bus line depending upon the state of the bit to be outputted. Many times the output buffer undergoes various transitions in driving bits over the bus lines.

For example, the output buffer may undergo selected-to-deselected and deselected-to-selected transitions as the output buffer is used in driving bits over the bus lines. For example, the output buffer may first be in a deselected state as the output buffer is not being used to drive any bits over a bus line. In the deselected state, the output buffer is electrically isolated from the bus line to avoid interfering with other output buffers that may be driving data over the same bus line, for example. When the output buffer is selected for driving signals over the bus line, the output buffer undergoes a deselected-to-selected transition to electrically couple the output buffer to the bus line in driving signals over the bus line.

The output buffer may also undergo high-to-low and low-to-high transitions in driving bits over the bus lines. For example, the output buffer may first output a logical-zero or low signal over a bit line and then output a logical-one or high signal over the same bit line. The output buffer undergoes a low-to-high transition in order to output the subsequent high signal.

Because of the various transitions the output buffer endures in outputting bits, the output of each bit onto a bus line is delayed. As a result of such delays, the performance of digital data processing systems becomes limited.

SUMMARY AND OBJECTS OF THE INVENTION

One of the objects of the present invention is to provide for relatively speedier signal transitions.

Another object of the present invention is to provide for relatively less delay in driving bits over a signal line.

Another object of the present invention is to provide for relatively less delay for the output enable access for an output buffer.

A method for generating an output signal for output buffer circuitry is described. A first voltage level is generated at a node. The first voltage level at the node is outputted as a buffer control signal for the output buffer circuitry to generate an output signal corresponding to a logical state. A second voltage level is generated at the node. The second voltage level is different from the first voltage level. The second voltage level at the node is outputted as the buffer control signal for the output buffer circuitry to generate the output signal corresponding to the logical state. The output signal corresponding to the logical state is generated in response to the buffer control signal.

An apparatus for generating an output signal is also described. The apparatus includes first circuitry for generating a first voltage level at a node and for generating a second voltage level at the node. The second voltage level is different from the first voltage level. The apparatus also includes second circuitry, coupled to the first circuitry, for outputting the first voltage level at the node as a buffer control signal to generate an output signal corresponding to a logical state and for outputting the second voltage level at the node as the buffer control signal to generate the output signal corresponding to the logical state. The apparatus further includes third circuitry, coupled to the second circuitry, for generating the output signal corresponding to the logical state in response to the buffer control signal.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

The following detailed description sets forth an embodiment or embodiments in accordance with the present invention for output enable access for an output buffer. In the following description, details are set forth such as specific circuit elements, device sizes, etc., in order to provide a thorough understanding of the present invention. It will be evident, however, that the present invention may be practiced without these specific details. In other instances, the operation of known devices and circuitry, specific parameters, etc., have not been described in particular detail so as not to obscure the present invention.

Figure 1:
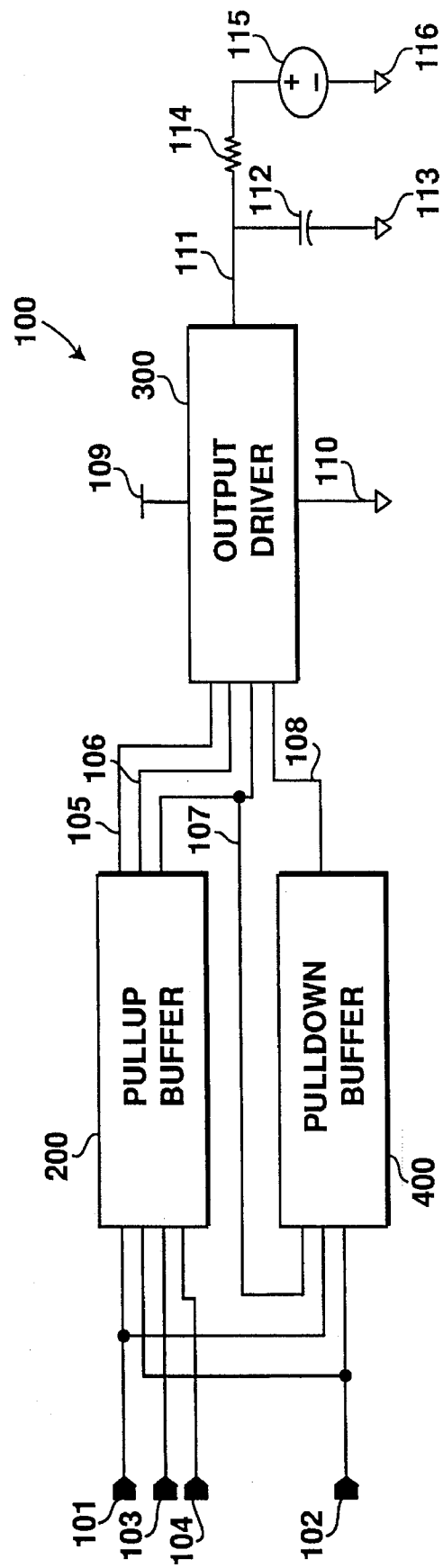
FIG. 1 illustrates circuitry for one embodiment for an output buffer having an output driver with pull-up and pull-down buffers.

FIG. 1 illustrates circuitry 100 for one embodiment for an output buffer. Circuitry 100 is referred to as an electrical apparatus and a device, for example. Circuitry 100 serves to generate and output over a single bit bus line, for example, an output signal having a regulated voltage level $V_{OH}$.

Circuitry 100 may include, for example, Bipolar Complementary Metal Oxide Semiconductor (BiCMOS) circuitry. For this detailed description, n-channel transistors and p-channel transistors used for circuitry 100 may each include, for example, n-channel metal oxide semiconductor (NMOS) transistors and p-channel metal oxide semiconductor (PMOS) transistors, respectively.

Circuitry 100 may be configured in a digital data processing system, for example, to output address, data, or control signals over bus lines. Circuitry 100 may be configured with other suitable output buffers to output a plurality of bits over bus lines. For example, a plurality of output buffers such as the one illustrated in FIG. 1 may be configured to simultaneously output a plurality of bits, each from a different one of the output buffers, over separate bit lines of a bus. Circuitry 100 may be configured to output data for a digital component such as a microprocessor, a data storage or memory device such as a static random access memory (SRAM), or a controller, for example. Circuitry 100 may be used to generate an output signal for other purposes.

Circuitry 100 is responsive to input signals gout 101, goutb 102, select 103, and $V_{REG}$ 104 and generates and outputs an output signal qout 111. Input signals gout 101 and goutb 102 may be differential input signals, for example. Input signal select 103 is a select signal for circuitry 100. Circuitry 100 is in a selected state or active when input signal select 103 is a high or a logical-one signal, for example. Circuitry 100 is in a deselected state or inactive when input signal select 103 is a low or a logical-zero signal, for example.

For this detailed description, a high signal may correspond to a logical-one signal and may have a voltage level of approximately 3.3 Volts or approximately 5.0 Volts, for example. A low signal may correspond to a logical-zero signal and may have a voltage level of approximately zero (0) Volts or approximately 1.8 Volts, for example. Other suitable voltage levels may also be used for high and low signals.

For one embodiment, high and low signals for input signals gout 101 and goutb 102 may correspond to voltage levels of approximately 3.0 Volts, for example, and approximately 2.0 Volts, for example, respectively. A high and low signal for input signal select may correspond to approximately 5.0 Volts, for example, and approximately zero (0) Volts, for example, respectively. Any suitable voltage level, such as approximately 3.5 Volts for example, may be used for input signal $V_{REG}$ 104.

Circuitry 100 generates and outputs an output signal qout 111 that corresponds to the logical state of input signal gout 101 when circuitry 100 is in the selected state. Circuitry 100 undergoes a pull-up transition to output a high output signal qout 111 when circuitry 100 is in the selected state and when input signal gout 101 undergoes a low-to-high transition. Circuitry 100 undergoes a pull-down transition to output a low output signal qout 111 when circuitry 100 is in the selected state and when input signal gout 101 undergoes a high-to-low transition. Circuitry 100 may receive input signal gout 101 and select 103 from a digital component, for example, for outputting an output signal qout 111 that corresponds to the logical state of input signal gout 101 over a bus line for that digital component.

Circuitry 100 includes a pull-up buffer 200, an output driver 300, and a pull-down buffer 400. As illustrated in FIG. 1, pull-up buffer 200 is responsive to input signals gout 101, goutb 102, select 103, and $V_{REG}$ 104 and generates and outputs control signals pu 105, pu1 106, and selb 107. Pull-down buffer 400 is responsive to input signals gout 101, goutb 102, and selb 107 and generates and outputs control signal pd 108. Output driver 300 may be, for example, a BiCMOS Darlington type output driver. Output driver 300 is coupled to a voltage terminal $V_{CCN}$ 109 and a voltage terminal $V_{SSN}$ 110. Any suitable voltage levels may be used for voltage terminals $V_{CCN}$ 109 and $V_{SSN}$ 110, such as approximately 5.0 Volts, for example, and approximately zero (0) Volts, for example, respectively. Output driver 300 is responsive to control signals pu 105, pu1 106, selb 107, and pd 108 and generates and outputs output signal qout 111.

As illustrated in FIG. 1, output signal qout 111 may be coupled as a Thevenin terminated output. Output signal qout 111 may be coupled to a voltage terminal 113 through a capacitor $C_L$ 112. Output signal qout 111 may also be coupled to a voltage terminal 116 through a resistor $R_{TH}$ 114 and a voltage source $V_{TH}$ 115. Any suitable voltage level, such as approximately zero (0) Volts for example, may be used for voltage terminals 113 and 116. Any suitable capacitance, such as approximately 85 picoFarads (pF) for example, may be used for capacitor $C_L$ 112. Any suitable resistance, such as approximately 167 ohms for example, may be used for resistor $R_{TH}$ 114. Any suitable voltage level, such as approximately 1.73 Volts for example, may be used for voltage source $V_{TH}$ 115. For other embodiments, output signal qout 111 may be coupled with other circuitry.

For a desired output enable access, circuitry 100 undergoes a transition from the deselected state to the selected state. For the deselected state, input signal select 103 is a low signal while a buffer that passes input signal gout 101 to circuitry 100 is disabled. This buffer may be a tristate buffer, for example. An output enable signal OEB for the buffer may be a high signal, for example, to disable the buffer. Circuitry 100 undergoes the transition to the selected state when input signal select 103 becomes a high signal and when the output enable signal OEB for the buffer becomes a low signal, enabling the buffer to pass input signal gout 101 to circuitry 100.

For one embodiment, the buffer may pass to circuitry 100 both input signals gout 101 and goutb 102. When the buffer is disabled, the buffer may generate both a high input signal gout 101 and a high input signal goutb 102 by use of suitable pull-up circuitry so that circuitry 100 consumes relatively less power. For another embodiment, the buffer may pass to circuitry 100 only one of these input signals, for example input signal gout 101. Input signals gout 101 and goutb 102 may be generated from a single input signal. The binary complement of the single input signal may be generated and inputted along with the single input signal. An inverter may be used, for example, to generate input signal goutb 102 using input signal gout 101.

For the deselected state, circuitry 100 generates an output signal qout 111 that achieves, for example, a steady-state voltage level approximately equal to the Thevenin voltage $V_{TH}$ when output signal qout 111 is coupled as a Thevenin terminated output. When input signal select 103 undergoes a low-to-high transition, then, circuitry 100 transitions to the selected state and generates an output signal qout 111 that corresponds to the logical state of input signal gout 101.

For the selected state, pull-up buffer 200 generates a low control signal selb 107 in response to a high input signal select 103. Pull-up buffer 200, in response to a high input signal gout 101 and a low input signal goutb 102, generates control signal pu 105 with a regulated voltage level and allows control signal pu1 106 to float. Pull-up buffer 200 is responsive to a low input signal gout 101 and a high input signal goutb 102 and generates a low control signal pu 105 and a low control signal pu1 106.

For the selected state as determined by a low control signal selb 107, pull-down buffer 400 is responsive to a high input signal gout 101 and a low input signal goutb 102 and generates a low control signal pd 108. Pull-down buffer 400 is responsive to a low input signal gout 101 and a high input signal goutb 102 and generates a high control signal pd 108.

For the selected state as determined by a low input signal selb 107, output driver 300 is responsive to the regulated voltage level of control signal pu 105, a floating control signal pu1 106, and a low control signal pd 108 (corresponding to a high input signal gout 101 and a low input signal goutb 102) and generates a high output signal qout 111. Output driver 300 is responsive to a low control signal pu 105, a low control signal pu1 106, and a high control signal pd 108 (corresponding to a low input signal gout 101 and a high input signal goutb 102) and generates a low output signal qout 111.

Pull-up buffer 200, output driver 300, and pull-down buffer 400 may each include any suitable circuitry for performing their functions as described.

Figure 2:
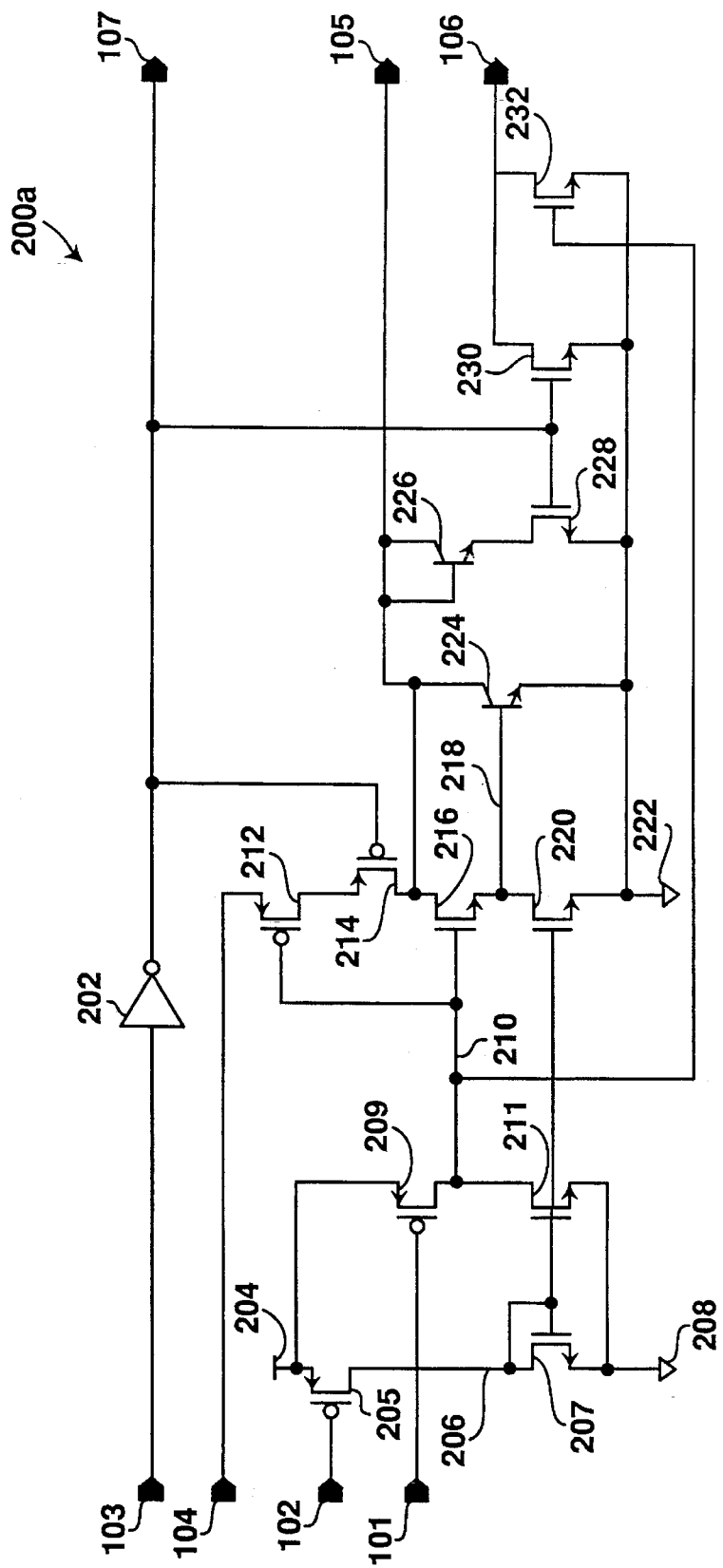
FIG. 2 illustrates circuitry for one embodiment for a pull-up buffer.

FIG. 2 illustrates circuitry 200a for one embodiment for pull-up buffer 200 of FIG. 1. Circuitry 200a is referred to as an electrical apparatus and a device, for example. Circuitry 200a of FIG. 2 generates control signals pu 105 and pu1 106 for output driver 300. For the selected state, circuitry 200a is responsive to a high input signal gout 101 for generating a control signal pu 105 that corresponds to input signal $V_{REG}$ 104 for output driver 300 and for allowing control signal pu1 106 to float.

Circuitry 200a of FIG. 2 includes an inverter 202. An input for inverter 202 is coupled to input signal select 103, and an output for inverter 202 is coupled to node or control signal selb 107. Inverter 202 inverts input signal select 103 as control signal selb 107.

Circuitry 200a of FIG. 2 also includes a voltage terminal 204, a voltage terminal 208, p-channel transistors 205 and 209, and n-channel transistors 207 and 211. Any suitable voltage level, such as approximately 5.0 Volts for example, may be used for voltage terminal 204. Any suitable voltage level, such as approximately zero (0) Volts for example, may be used for voltage terminal 208.

The source and drain of p-channel transistor 205 are coupled to voltage terminal 204 and to the drain of n-channel transistor 207 at node 206, respectively. The source of n-channel transistor 207 is coupled to voltage terminal 208. The gate of p-channel transistor 205 is coupled to input signal goutb 102. P-channel transistor 205 couples voltage terminal 204 to node 206 when p-channel transistor 205 is turned-on by a low input signal goutb 102. The gate of n-channel transistor 207 is coupled to node 206. N-channel transistor 207 couples node 206 to voltage terminal 208 when n-channel transistor 207 is turned-on by a high signal at node 206.

The source and drain of p-channel transistor 209 are coupled to voltage terminal 204 and to the drain of n-channel transistor 211 at node 210, respectively. The source of n-channel transistor 211 is coupled to voltage terminal 208. The gate of p-channel transistor 209 is coupled to input signal gout 101. P-channel transistor 209 couples voltage terminal 204 to node 210 when p-channel transistor 209 is turned-on by a low input signal gout 101. The gate of n-channel transistor 211 is coupled to node 206. N-channel transistor 211 couples node 210 to voltage terminal 208 when n-channel transistor 211 is turned-on by a high input signal at node 206.

Circuitry 200a further includes voltage terminal 222, p-channel transistors 212 and 214, n-channel transistors 216, 220, 228, 230, and 232, and npn bipolar transistors 224 and 226. Any suitable voltage level, such as approximately zero (0) Volts for example, may be used for voltage terminal 222.

The source and drain of p-channel transistor 212 are coupled to input signal $V_{REG}$ 104 and to the source of p-channel transistor 214, respectively. The drain of p-channel transistor 214 is coupled to node or control signal pu 105. The gate of p-channel transistor 212 is coupled to node 210. P-channel transistor 212 couples input signal $V_{REG}$ 104 to the source of p-channel transistor 214 when p-channel transistor 212 is turned-on by a low signal at node 210. The gate of p-channel transistor 214 is coupled to node or control signal selb 107. P-channel transistor 214 couples input signal $V_{REG}$ 104 (when p-channel transistor 212 is turned-on) to node or control signal pu 105 when p-channel transistor 214 is turned-on by a low control signal selb 107.

The drain and source of n-channel transistor 216 are coupled to node or control signal pu 105 and to the drain of n-channel transistor 220 at node 218, respectively. The source of n-channel transistor 220 is coupled to voltage terminal 222. The gate of n-channel transistor 216 is coupled to node 210. N-channel transistor 216 couples node or control signal pu 105 to node 218 when n-channel transistor 216 is turned-on by a high signal at node 210. The gate of n-channel transistor 220 is coupled to node 206. N-channel transistor 220 couples node 218 to voltage terminal 222 when n-channel transistor 220 is turned-on by a high signal at node 206.

The collector and emitter of bipolar transistor 224 are coupled to node or control signal pu 105 and to voltage terminal 222, respectively. The base of bipolar transistor 224 is coupled to node 218. Bipolar transistor 224 couples node or control signal pu 105 to voltage terminal 222.

The collector and emitter of bipolar transistor 226 are coupled to node or control signal pu 105 and to the drain of n-channel transistor 228, respectively. The source of n-channel transistor 228 is coupled to voltage terminal 222. The base of bipolar transistor 226 is coupled to node or control signal pu 105. Bipolar transistor 226 couples node or control signal pu 105 to the drain of n-channel transistor 228. The gate of n-channel transistor 228 is coupled to node or control signal selb 107. N-channel transistor 228 couples the emitter of bipolar transistor 226 to voltage terminal 222 when n-channel transistor 228 is turned-on by a high control signal selb 107.

The drain and source of n-channel transistor 230 are coupled to node or control signal pu1 106 and to voltage terminal 222, respectively. The gate of n-channel transistor 230 is coupled to node or control signal selb 107. N-channel transistor 230 couples control signal pu1 106 to voltage terminal 222 when n-channel transistor 230 is turned-on by a high control signal selb 107.

The drain and source of n-channel transistor 232 are coupled to node or control signal pu1 106 and to voltage terminal 222, respectively. The gate of n-channel transistor 232 is coupled to node 210. N-channel transistor 232 couples control signal pu1 106 to voltage terminal 222 when n-channel transistor 232 is turned-on by a high signal at node 210.

For the deselected state, inverter 202 outputs a high control signal selb 107 in response to a low control signal select 103. N-channel transistor 230 is turned-on by the high control signal selb 107 and couples node or control signal pu1 106 to voltage terminal 222.

When circuitry 100 of FIG. 1 transitions to the selected state to drive an output signal qout 111 that corresponds to a high input signal gout 101, circuitry 200a receives a high input signal gout 101, a low input signal goutb 102, and a high signal select 103.

As input signal select 103 goes high for the selected state, inverter 202 outputs a low control signal selb 107, turning-off n-channel transistors 228 and 230 and turning-on p-channel transistor 214.

As input signal gout 101 goes high and goutb 102 goes low, p-channel transistor 209 is turned-off and p-channel transistor 205 is turned-on, respectively. P-channel transistor 205 couples voltage terminal 204 to node 206, turning-on n-channel transistors 207 and 211. When n-channel transistor 211 is turned-on, node 210 is forced low as n-channel transistor 211 couples node 210 to voltage terminal 208. P-channel transistor 212 is turned-on by the low signal at node 210, coupling input signal $V_{REG}$ 104 to node or control signal pu 105 as p-channel transistor 214 is also turned-on.

N-channel transistor 216 is turned-off by the low signal at node 210. N-channel transistor 220 is turned-on by the high signal at node 206, coupling the base of bipolar transistor 224 to voltage terminal 222 such that bipolar transistor 224 is switched-off. N-channel transistor 228 is turned-off by a low control signal selb 107. As n-channel transistor 230 is turned-off by a low control signal selb 107 and as n-channel transistor 232 is turned-off by a low signal at node 210, circuitry 200a allows control signal pu1 106 to float.

For one embodiment where an approximately 0.5 μm channel length technology is used, each transistor for circuitry 200a may have an approximate channel width as listed in Table I, for example. Other suitable channel lengths and widths may also be used for each transistor for circuitry 200a.

TABLE I

| TRANSISTOR | APPROXIMATE WIDTH |
|---|---|
| p-channel 205 | 10.0 μm |
| n-channel 207 | 5.0 μm |
| p-channel 209 | 40.0 μm |
| n-channel 211 | 20.0 μm |
| p-channel 212 | 30.0 μm |
| p-channel 214 | 30.0 μm |
| n-channel 216 | 7.0 μm |
| n-channel 220 | 2.6 μm |
| n-channel 228 | 8.8 μm |
| n-channel 230 | 26.2 μm |
| n-channel 232 | 22.8 μm |

Bipolar transistors 224 and 226 may have emitter areas of approximately 3.3 μm², for example, and of approximately 3.3 μm², for example, respectively. Other suitable emitter areas may also be used for each bipolar transistor 224 and 226. Inverter 202 may be designed with any suitable technology. Inverter 202 may be designed with CMOS technology, for example, and may include an approximately 25.2 μm wide p-channel transistor, for example, and an approximately 16.8 μm wide n-channel transistor, for example. Inverter 202 may include transistors having other suitable channel lengths and widths.

Figure 3:
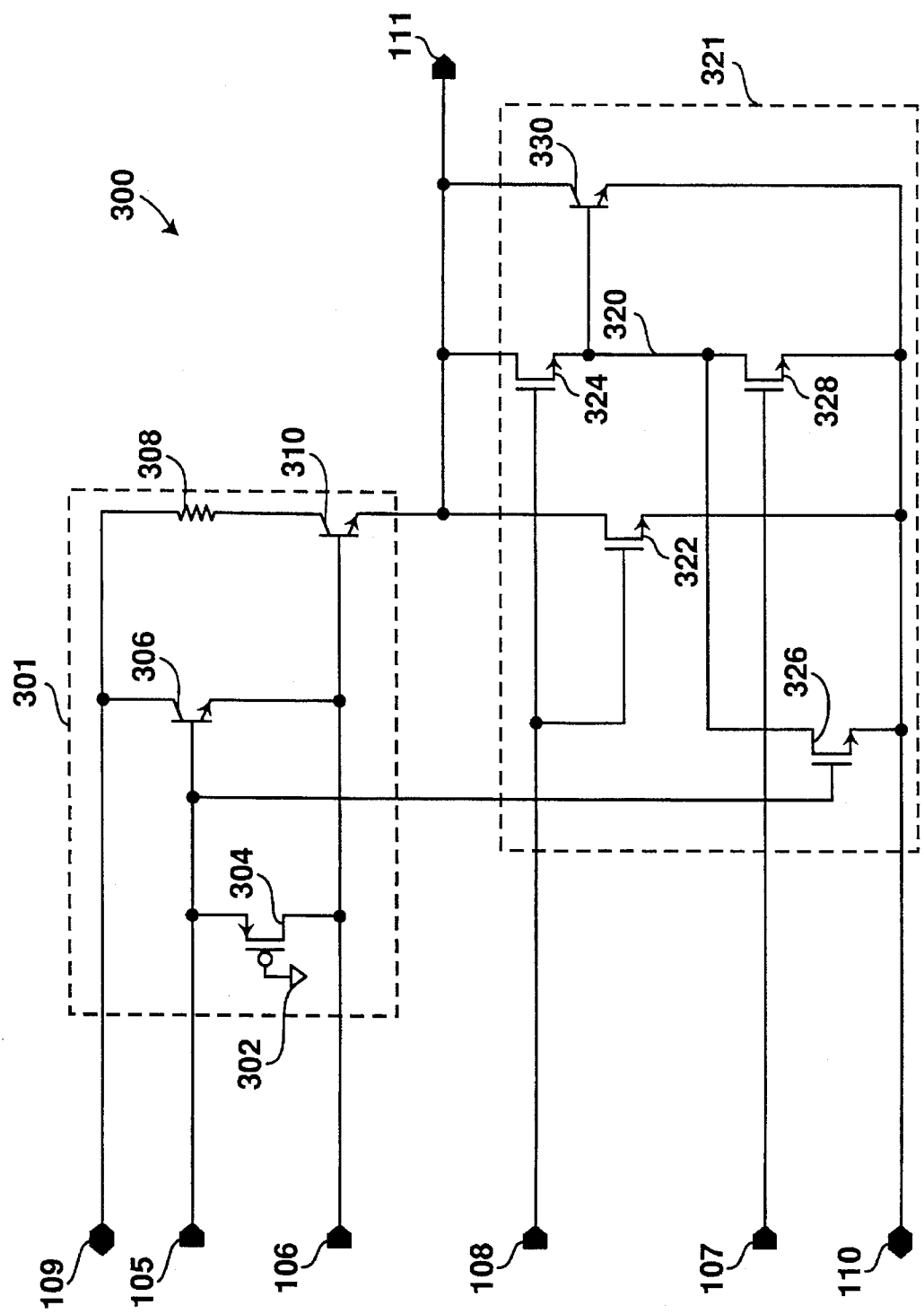
FIG. 3 illustrates circuitry for one embodiment for an output driver.

FIG. 3 illustrates circuitry 300 for one embodiment for output driver 300 of FIG. 1. Circuitry 300 is referred to as an electrical apparatus and a device, for example. As illustrated in FIG. 3, circuitry 300 includes circuitry 301 for a pull-up transition for output signal qout 111 in response to control signals pu 105 and pu1 106, for example. Circuitry 301 includes a voltage terminal 302, a p-channel transistor 304, npn bipolar transistors 306 and 310, and a resistor 308. Any suitable voltage level, such as approximately zero (0) Volts for example, may be used for voltage terminal 302.

The source and drain of p-channel transistor 304 are coupled to node or control signal pu 105 and to node or control signal pu1 106, respectively. The gate of p-channel transistor 304 is coupled to voltage terminal 302. P-channel transistor 304 couples node or control signal pu 105 to node or control signal pu1 106 when p-channel transistor 304 is turned-on by the low signal from voltage terminal 302.

The collector and emitter of npn bipolar transistor 306 are coupled to voltage terminal $V_{CCN}$ 109 and to node or control signal pu1 106, respectively. The base of bipolar transistor 306 is coupled to control signal pu 105. Bipolar transistor 306 couples voltage terminal $V_{CCN}$ 109 to node or control signal pu1 106.

The collector of npn bipolar transistor 310 is coupled to voltage terminal $V_{CCN}$ 109 through resistor 308. Resistor 308 is an output couple circuit current limiting resistor. The emitter and base of bipolar transistor 310 are coupled to node or output signal qout 111 and to control signal pu1 106, respectively. Bipolar transistor 310 couples output signal qout 111 to voltage terminal $V_{CCN}$ 109.

For one embodiment for output buffer 100 of FIG. 1 where pull-up buffer 200 includes circuitry 200a of FIG. 2 and output driver 300 includes circuitry 301 of FIG. 3, output signal qout 111 undergoes a pull-up transition in response to a high input signal gout 101 and a low input signal goutb 102.

For the deselected state, circuitry 200a of FIG. 2 generates a low control signal pu1 106, grounding the base of bipolar transistor 310 of circuitry 301. Output signal qout 111 achieves, for example, a steady-state voltage level approximately equal to the Thevenin voltage $V_{TH}$ when output signal qout 111 is coupled as a Thevenin terminated output.

When circuitry 100 of FIG. 1 transitions to the selected state to drive an output signal qout 111 that corresponds to a high input signal gout 101, circuitry 200a generates a control signal pu 105 that corresponds to input signal $V_{REG}$ 104. Bipolar transistor 306 is switched-on by this $V_{REG}$ signal and drives the base of bipolar transistor 310. As p-channel transistor 304 is turned-on by voltage terminal 302 and couples control signal pu 105 to control signal pu1 106, the base of bipolar transistor 310 reaches a voltage level corresponding to that of $V_{REG}$.

Initially, the $V_{BE}$ level for bipolar transistor 310 is approximately $V_{REG}-V_{TH}$, for example, when output signal qout 111 is coupled as a Thevenin terminated output. $V_{BE}$ is the external voltage level between the base and emitter for bipolar transistor 310. With a $V_{REG}$ level of approximately 3.5 Volts, for example, and a $V_{TH}$ level of approximately 1.73 Volts, for example, the initial $V_{BE}$ level for bipolar transistor 310 is less than approximately 1.8 Volts. Bipolar transistor 310 is switched-on by this $V_{BE}$ level and drives output signal qout 111 to a voltage level of approximately $V_{REG}-V_{be}$, where $V_{be}$ is the intrinsic base-to-emitter voltage level for bipolar transistor 310. With a $V_{REG}$ level of approximately 3.5 Volts, for example, and a $V_{be}$ level for bipolar transistor 310 of approximately 0.7 Volts, for example, output signal qout 111 reaches a regulated voltage level of approximately 2.8 Volts.

For one embodiment where an approximately 0.5 μm channel length technology is used for circuitry 301, p-channel transistor 304 may have a width of approximately 18.2 μm, for example. Other suitable channel lengths and widths may also be used for p-channel transistor 304. Bipolar transistors 306 and 310 may have emitter areas of approximately 11.0 μm², for example, and of approximately 52.8 μm², for example, respectively. Other suitable emitter areas may also be used for each bipolar transistor 306 and 310. Resistor 308 may have a resistance of approximately 27 ohms, for example. Other suitable resistances may also be used for resistor 308.

Circuitry 301 of output driver 300 for a pull-up transition for output signal qout 111 may be replaced with other suitable circuitry for outputting a high output signal qout 111 in response to a control signal, such as control signals pu 105 and pu1 106 for example.

Figure 4:
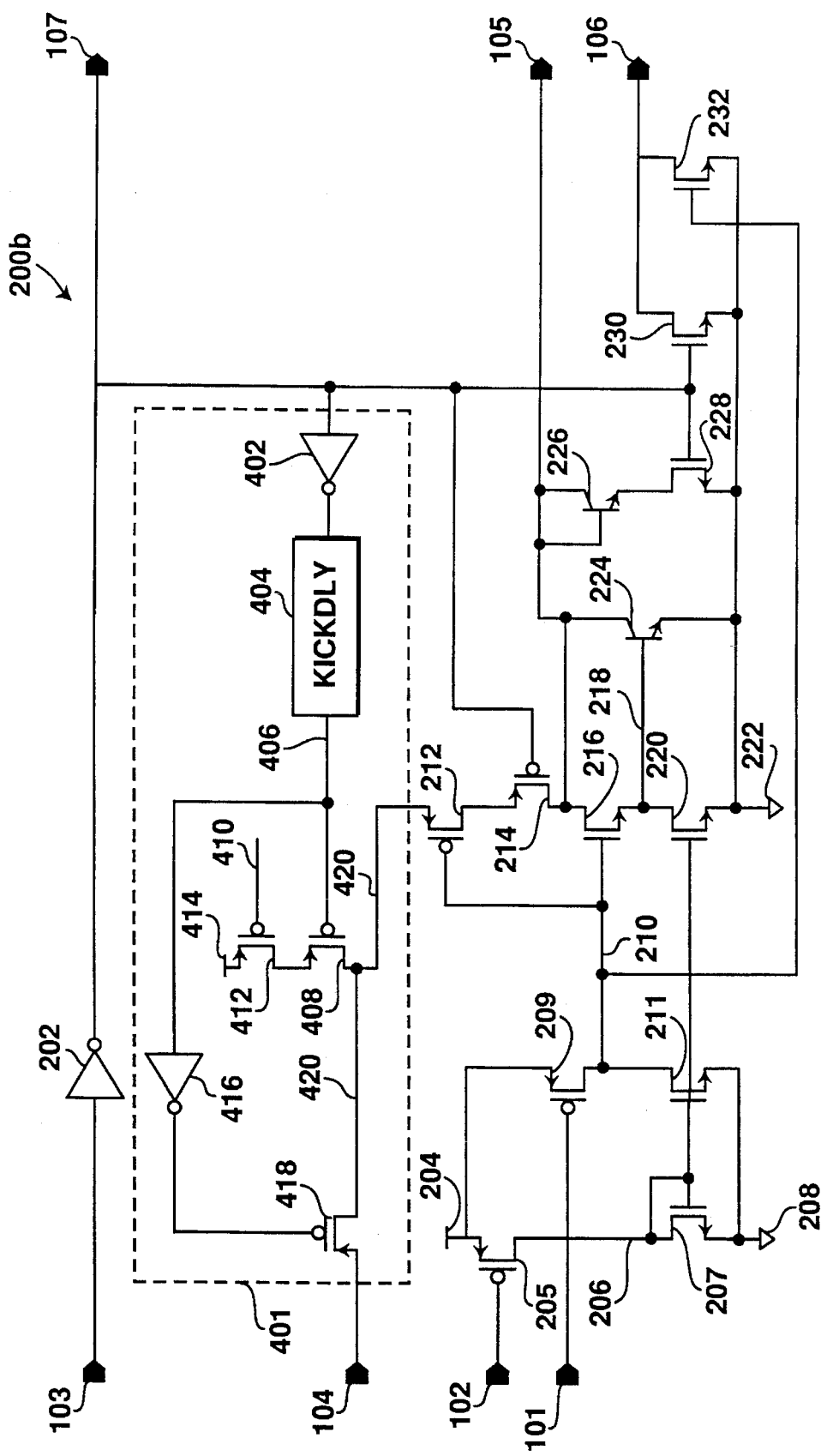
FIG. 4 illustrates circuitry for another embodiment for a pull-up buffer.

FIG. 4 illustrates circuitry 200*b* for another embodiment for pull-up buffer 200 of FIG. 1. Circuitry 200*b* is referred to as an electrical apparatus and a device, for example. Circuitry 200*b* of FIG. 4 generates control signals pu 105 and pu1 106 for output driver 300. For the selected state, circuitry 200*b* is responsive to a high input signal gout 101 and a low input signal goutb 102 for generating a controlled voltage signal as control signal pu 105 for output driver 300 and for allowing control signal pu1 106 to float.

Circuitry 200*b* includes inverter 202, p-channel transistors 205, 209, 212, and 214, n-channel transistors 207, 211, 216, 220, 228, 230, and 232, and npn bipolar transistors 224 and 226 that are similar to and configured similarly as their corresponding elements having like references for circuitry 200*a* of FIG. 2.

Circuitry 200*b* further includes circuitry 401 for controlling a voltage signal at a node 420 to be outputted as control signal pu 105 for the selected state in response to a high input signal gout 101 and a low input signal goutb 102. Circuitry 401 is responsive to input signals $V_{REG}$ 104, selb 107, a p-channel reference signal 410, and a voltage terminal $V_{CC}$ 414 and generates and outputs a controlled voltage signal at node 420. Any suitable voltage level, such as approximately 4.2 Volts for example, may be used for voltage terminal $V_{CC}$ 414.

The source of p-channel transistor 212 is coupled to node 420 for circuitry 200*b* as illustrated in FIG. 4 as opposed to being directly coupled to input signal $V_{REG}$ 104 for circuitry 200*a* as illustrated in FIG. 2.

When circuitry 200*b* of FIG. 4 transitions from the deselected state to the selected state and receives a high input signal gout 101 and a low input signal goutb 102, circuitry 200*b* outputs a control signal pu 105 having an initial voltage level corresponding to voltage terminal $V_{CC}$ 414 and having a subsequent voltage level corresponding to input signal $V_{REG}$ 104. Circuitry 401 controls the generation of these voltage levels at node 420 for output as control signal pu 105. Circuitry 401 is also referred to as an output enable (OE) kicker circuit.

Circuitry 401 includes inverters 402 and 416, delay circuitry or kickdly circuitry 404, and p-channel transistors 408, 412, and 418. An input for inverter 402 is coupled to control signal selb 107, and an output for inverter 402 is coupled to an input for kickdly circuitry 404. Inverter 402 inverts input signal selb 107 as an input signal for kickdly circuitry 404.

An output for kickdly circuitry 404 is coupled to a node 406. Kickdly circuitry 404 propagates the signal outputted from inverter 402 to node 406 at a delay. For one embodiment, kickdly circuitry 404 includes an RC/inverter chain non-inverting delay that delays the signal outputted from inverter 402 in the range of approximately 1.0 nanoseconds (ns) to approximately 1.5 ns, for example. Kickdly circuitry 404 may include other suitable circuitry to provide for a non-inverting delay for the signal outputted from inverter 402. The delay for the signal outputted from inverter 402 may be lengthened or shortened to some other suitable duration and may depend, for example, on the circuitry used for kickdly circuitry 404.

The source and drain of p-channel transistor 412 are coupled to voltage terminal $V_{CC}$ 414 and to the source of p-channel transistor 408, respectively. The gate of p-channel transistor 412 is coupled to p-channel reference signal 410. P-channel transistor 412 couples voltage terminal $V_{CC}$ 414 to the source of p-channel transistor 408 when p-channel transistor 412 is turned-on by a low reference signal 410. P-channel reference signal 410 is a logical-zero signal for the deselected and the selected states. P-channel transistor 412 is therefore logically turned-on for these states. P-channel reference signal 410 may be used, for example, to control current flow when p-channel transistor 412 couples voltage terminal $V_{CC}$ 414 to the source of p-channel transistor 408.

The drain of p-channel transistor 408 is coupled to node 420. The gate of p-channel transistor 408 is coupled to node 406. P-channel transistor 408 couples voltage terminal $V_{CC}$ 414 through p-channel transistor 412 to node 420 when p-channel transistor 408 is turned-on by a low signal at node 406.

An input for inverter 416 is coupled to node 406, and an output for inverter 416 is coupled to the gate of p-channel transistor 418. Inverter 416 inverts the signal at node 406. The source and drain of p-channel transistor 418 are coupled to input signal $V_{REG}$ 104 and to node 420, respectively. P-channel transistor 418 couples input signal $V_{REG}$ 104 to node 420 when p-channel transistor 418 is turned-on by a low signal from the output of inverter 416.

For the deselected state, inverter 402 is responsive to a high control signal selb 107 and outputs a low signal to kickdly circuitry 404. Kickdly circuitry 404 outputs to node 406 this same signal at a delay as determined by kickdly circuitry 404, turning-on p-channel transistor 408. Because p-channel transistor 412 is logically turned-on by a low reference signal 410, p-channel transistor 408 couples voltage terminal $V_{CC}$ 414 to node 420. P-channel transistor 418 is turned-off by a high signal outputted from inverter 416 in response to the low signal at node 406. As p-channel transistor 214 is turned-off by the high signal selb 107, the voltage signal at node 420 is not coupled to node or control signal pu 105.

When circuitry 100 of FIG. 1 transitions from the deselected to the selected state to drive a high input signal gout 101 as output signal qout 111, circuitry 200*b* receives a high input signal gout 101, a low input signal goutb 102, and a high signal select 103.

For the selected state, circuitry 200*b* of FIG. 4 generates a control signal pu 105 having a voltage level corresponding to the signal at node 420. P-channel transistor 212 is turned-on by a low signal at node 210 in response to a high input signal gout 101 and a low input signal goutb 102, and p-channel transistor 214 is turned-on by a low control signal selb 107. P-channel transistors 212 and 214 couple the signal at node 420 to node or control signal pu 105. P-channel transistors 212 and 214 may be replaced with other suitable gating circuitry for coupling the signal at node 420 to node or control signal pu 105 in response to a control signal, such as input signals gout 101 and select 103 for example.

Inverter 402 of circuitry 401 is responsive to the low control signal selb 107 and outputs a high signal to kickdly circuitry 404. Because this high signal is delayed by kickdly circuitry 404, the low signal outputted from kickdly circuitry 404 for the deselected state remains at node 406 for an initial period of time after the transition to the selected state. This initial period of time corresponds to the delay as determined by kickdly circuitry 404. As p-channel transistor 408 remains on and p-channel transistor 418 remains off for this initial period of time, circuitry 401 continues to couple voltage terminal $V_{CC}$ 414 to node 420. Circuitry 200b for the selected state thus initially generates a control signal pu 105 having a voltage level corresponding to voltage terminal $V_{CC}$ 414.

After the delay as determined by kickdly circuitry 404, node 406 undergoes a low-to-high transition as kickdly circuitry 404 outputs the high signal from inverter 402 for the selected state. The high signal at node 406 turns p-channel transistor 408 off, decoupling voltage terminal $V_{CC}$ 414 from node 420. Inverter 416 is responsive to the high signal at node 406 and outputs a low signal, turning-on p-channel transistor 418 to couple input signal $V_{REG}$ 104 to node 420. Node 420 thus undergoes a transition for the selected state as it is initially coupled to voltage terminal $V_{CC}$ 414 and is subsequently coupled to input signal $V_{REG}$ 104. Circuitry 200b thus generates for the selected state a control signal pu 105 having an initial voltage level corresponding to voltage terminal $V_{CC}$ 414 and having a subsequent voltage level corresponding to input signal $V_{REG}$ 104.

To help stabilize the $V_{REG}$ voltage level of control signal pu 105, circuitry 200b preferably decouples voltage terminal $V_{CC}$ 414 from node 420 before circuitry 200b couples input signal $V_{REG}$ 104 to node 420. More clearly, circuitry 200b preferably ensures p-channel transistors 408 and 418 are not turned-on simultaneously. As illustrated in FIG. 4, the same signal at node 406 controls both p-channel transistors 408 and 418. The gate of p-channel transistor 408 is directly coupled to node 406 while the gate of p-channel transistor 418 is coupled to node 406 through inverter 416. A high signal at node 406 may therefore turn-off p-channel transistor 408 before a corresponding low signal from inverter 416 turns-on p-channel transistor 418 as the signal at node 406 is delayed by inverter 416 in being propagated to p-channel transistor 418.

For one embodiment for output buffer 100 of FIG. 1 where pull-up buffer 200 includes circuitry 200b of FIG. 4 and output driver 300 includes circuitry 301 of FIG. 3, output signal qout 111 undergoes a pull-up transition in response to a high input signal gout 101 and a low input signal goutb 102.

For the deselected state, circuitry 200b of FIG. 4 generates a low control signal pu1 106, grounding the base of bipolar transistor 310 of circuitry 301. Output signal qout 111 achieves, for example, a steady-state voltage level approximately equal to the Thevenin voltage $V_{TH}$ when output signal qout 111 is coupled as a Thevenin terminated output.

When circuitry 100 of FIG. 1 transitions to the selected state to drive an output signal qout 111 that corresponds to a high input signal gout 101, circuitry 200b generates a control signal pu 105 that has an initial voltage level corresponding to voltage terminal $V_{CC}$ 414. Bipolar transistor 306 is switched-on by this $V_{CC}$ signal and drives the base of bipolar transistor 310. As p-channel transistor 304 is turned-on by voltage terminal 302 and couples control signal pu 105 to control signal pu1 106, the base of bipolar transistor 310 reaches a voltage level corresponding to that of $V_{CC}$.

Initially, the $V_{BE}$ level for bipolar transistor 310 is approximately $V_{CC}-V_{TH}$, for example, when output signal qout 111 is coupled as a Thevenin terminated output. $V_{BE}$ is the external voltage level between the base and emitter for bipolar transistor 310. With a $V_{CC}$ level of approximately 4.2 Volts, for example, and a $V_{TH}$ level of approximately 1.73 Volts, for example, the initial $V_{BE}$ level for bipolar transistor 310 is approximately 2.47 Volts. Other suitable voltage levels may also be used for $V_{CC}$ and $V_{TH}$. Bipolar transistor 310 is switched-on by this $V_{BE}$ level and drives output signal qout 111.

Circuitry 200b subsequently generates a control signal pu 105 having a voltage level corresponding to input signal $V_{REG}$ 104. The voltage level for input signal $V_{REG}$ 104 may be, for example, approximately 3.5 Volts. Other suitable voltage levels may also be used for $V_{REG}$. Bipolar transistor 306 remains switched-on by this $V_{REG}$ voltage level and continues to drive the base of bipolar transistor 310. As p-channel transistor 304 is turned-on by voltage terminal 302 and couples control signal pu 105 to control signal pu1 106, the base of bipolar transistor 310 is driven to a voltage level corresponding to that of $V_{REG}$. Bipolar transistor 310 remains switched-on and drives output signal qout 111 to a voltage level of approximately $V_{REG}-V_{be}$, where $V_{be}$ is the intrinsic base-to-emitter voltage level for bipolar transistor 310. With a $V_{REG}$ level of approximately 3.5 Volts, for example, and a $V_{be}$ level for bipolar transistor 310 of approximately 0.7 Volts, for example, output signal qout 111 reaches a regulated voltage level of approximately 2.8 Volts.

To limit any overshoot beyond a steady-state voltage level of the regulated output voltage level $V_{OH}$ for output signal qout 111 by output driver 300, reference signal 410 may be used, for example, to control p-channel transistor 412 of circuitry 401. P-channel transistor 412 limits the amount of current supplied to output driver 300. P-channel transistor 412 may have any suitable size for controlling the amount of current supplied by voltage terminal $V_{CC}$ 414. For one embodiment where circuitry 301 of FIG. 3 is used for output driver 300, p-channel transistor 412 limits the amount of current supplied to bipolar transistor 306 and bipolar transistor 310.

For one embodiment where an approximately 0.5 μm channel length technology is used for circuitry 401, p-channel transistor 408 may have a width of approximately 30.0 μm, for example. P-channel transistor 412 may have a width of approximately 60.0 μm, for example. P-channel transistor 418 may have a width of approximately 65.6 μm, for example. Other suitable channel lengths and widths may also be used for each transistor for circuitry 401. Inverter 402 and 416 may be designed with any suitable technology. Inverters 402 and 416 may be designed with CMOS technology, for example. Inverter 402 may include an approximately 10.0 μm wide p-channel transistor, for example, and an approximately 10.0 μm wide n-channel transistor, for example. Inverter 416 may include an approximately 25.0 μm wide p-channel transistor, for example, and an approximately 25.0 μm wide n-channel transistor, for example. Inverters 402 and 416 may include transistors having other suitable channel lengths and widths.

Circuitry 401 of circuitry 200b for generating a controlled voltage signal for output driver 300 may be replaced with other suitable circuitry for outputting control signal pu 105 having an initial voltage level corresponding to a voltage source $V_{CC}$ and having a subsequent voltage level corresponding to an input signal $V_{REG}$ in response to a select signal, such as control signal selb 107 for example.

For one embodiment, kickdly circuitry 404 may be configured to receive as an input control signal select 103 as opposed to receiving the signal output from inverter 402.

The delay for kickdly circuitry 404 may need to be adjusted for this embodiment as kickdly circuitry 404 receives control signal select 103 relatively earlier without the non-inverting delay of control signal select 103 by inverters 202 and 402.

Other suitable circuitry may be used, for example in place of inverter 416 and p-channel transistors 408, 412, and 418, for controlling the voltage level at node 420 in response to a control signal, such as the delayed signal at node 406 for example.

As compared to the output enable access for an output buffer having circuitry 200a of FIG. 2, circuitry 200b provides for relatively improved performance for output driver 300. Circuitry 200b provides for a relatively improved data output pull-up performance for an output enable access for output driver 300, for example.

For either circuitry 200a or 200b, input signal $V_{REG}$ 104 may be used as a voltage reference for a plurality of output buffers, for example, four, five, eight, or nine output buffers depending, for example, on the application for which the output buffers are to be used. The current requirement for input signal $V_{REG}$ 104 increases as more output buffers are supplied by the same input signal $V_{REG}$ 104. Because the current sourcing of input signal $V_{REG}$ 104 may be limited due to the practicability of device sizes, for example, the performance of output driver 300 as controlled by circuitry 200a of FIG. 2 may be limited.

When configured with circuitry 301 for output driver 300 having a Thevenin terminated output for a high data output enable access, circuitry 200a outputs a control signal pu 105 corresponding to input signal $V_{REG}$ 104, providing for an initial $V_{BE}$ voltage level less than approximately 1.8 Volts for bipolar transistor 310 with a $V_{REG}$ level of approximately 3.5 Volts and a $V_{TH}$ level of approximately 1.73 Volts.

Circuitry 200b, however, outputs a control signal pu 105 having an initial voltage level corresponding to voltage terminal $V_{CC}$ 414, providing for an initial $V_{BE}$ voltage level of approximately 2.47 Volts for bipolar transistor 310 with a $V_{CC}$ level of approximately 4.2 Volts and a $V_{TH}$ level of approximately 1.73 Volts. Circuitry 200b subsequently outputs a control signal pu 105 having a voltage level corresponding to input signal $V_{REG}$ 104 so that bipolar transistor 310 drives a high output signal qout 111 with a steady-state voltage level of approximately $V_{REG}-V_{be}$. As compared to circuitry 200a, circuitry 200b provides for a relatively faster pull-up transition for output signal qout 111 as the initially higher $V_{BE}$ voltage level for bipolar transistor 310 provides relatively more drive for output signal qout 111 so that output signal qout 111 reaches a regulated steady-state high voltage level relatively faster. Circuitry 200b thus helps to improve the slew rate for output signal qout 111.

Circuitry 200b may also be configured to provide for relatively less delay for a low-to-high output signal transition for an output buffer while the output buffer is in a selected state. Circuitry 200b may be configured to output a control signal pu 105 having an initial voltage level corresponding to a first voltage level $V_{CC}$ and having a subsequent voltage level corresponding to a second voltage level $V_{REG}$ in response to a low-to-high transition for input signal gout 101, for example.

For other embodiments, such as MOS-based circuits having reference controlled slew rates for example, suitable circuitry may be similarly used as circuitry 401 in bypassing a reference control path to provide for a relatively faster initial output transition.

As illustrated in FIG. 3, circuitry 300 also includes circuitry 321 for a pull-down transition for output signal qout 111 in response to control signals pu 105 and pd 108, for example. Circuitry 321 includes n-channel transistors 322, 324, 326, and 328, and npn bipolar transistor 330.

The drain and source of n-channel transistor 322 are coupled to node or output signal qout 111 and to voltage terminal 110, respectively. The drain and source of n-channel transistor 324 are coupled to node or output signal qout 111 and to the drain of n-channel transistor 328 at node 320, respectively. The source of n-channel transistor 328 is coupled to voltage terminal 110. The drain and source of n-channel transistor 326 are coupled to node 320 and to voltage terminal 110, respectively. The collector and emitter of npn bipolar transistor 330 are coupled to node or output signal qout 111 and to voltage terminal 110, respectively.

The gate of n-channel transistor 322 is coupled to control signal pd 108. N-channel transistor 322 couples node or output signal qout 111 to voltage terminal 110 when n-channel transistor 322 is turned-on by a high control signal pd 108. The gate of n-channel transistor 324 is coupled to control signal pd 108. N-channel transistor 324 couples node or output signal qout 111 to node 320 when n-channel transistor 324 is turned-on by a high control signal pd 108. N-channel transistor 324 is in a source follower mode with n-channel transistor 322.

The gate of n-channel transistor 326 is coupled to control signal pu 105. N-channel transistor 326 couples node 320 to voltage terminal 110 when n-channel transistor 326 is turned-on by a high control signal pu 105. The gate of n-channel transistor 328 is coupled to input signal selb 107. N-channel transistor 328 couples node 320 to voltage terminal 110 when n-channel transistor 328 is turned-on by a high input signal selb 107. The base of npn bipolar transistor 330 is coupled to node 320. Bipolar transistor 330 couples output signal qout 111 to voltage terminal 110.

For one embodiment for output buffer 100 of FIG. 1 where output driver 300 includes circuitry 321 of FIG. 3, output signal qout 111 undergoes a pull-down transition in a staggered fashion in response to a low input signal gout 101 and a high input signal goutb 102.

For the deselected state, circuitry 321 is responsive to a high control signal selb 107 that turns-on n-channel transistor 328. N-channel transistor 328 couples node 320 to voltage terminal 110, grounding the base of bipolar transistor 330 of circuitry 321. Output signal qout 111 achieves, for example, a steady-state voltage level approximately equal to the Thevenin voltage $V_{TH}$ when output signal qout 111 is coupled as a Thevenin terminated output.

When circuitry 100 of FIG. 1 transitions to the selected state to drive an output signal qout 111 that corresponds to a low input signal gout 101, pull-down buffer 400 generates a high control signal pd 108, starting a relatively slow low-going transition for output signal qout 111 as output signal qout 111 becomes coupled to voltage terminal 110 through n-channel transistor 322. N-channel transistor 324, that is in a source follower mode, is then turned-on by the high control signal pd 108 and couples output signal qout 111 to node 320. Bipolar transistor 330 is turned-on by the signal at node 320, resulting in a relatively rapid low-going transition for output signal qout 111 as bipolar transistor 330 couples output signal qout 111 to voltage terminal 110. When output signal qout 111 reaches the voltage level between the base and emitter ($V_{be}$) of bipolar transistor 330, bipolar transistor 330 shuts off. Bipolar transistor 330 does not completely pull-down output signal qout 111 to voltage terminal 110. N-channel transistor 322, that is turned-on by control signal pd 108, completes the pull-down of output signal qout 111, coupling node or output signal qout 111 to voltage terminal 110.

For one embodiment where an approximately 0.5 µm channel length technology is used, each transistor for circuitry 321 may have an approximate width as listed in Table II, for example. Other suitable channel lengths and widths may also be used for each transistor for circuitry 321.

TABLE II

| TRANSISTOR | APPROXIMATE WIDTH |
| --- | --- |
| n-channel 322 | 41.3 µm |
| n-channel 324 | 84.0 µm |
| n-channel 326 | 17.5 µm |
| n-channel 328 | 17.5 µm |

Bipolar transistor 330 may have an emitter area of approximately 52.8 µm$^2$, for example. Other suitable emitter areas may also be used for bipolar transistor 330.

Circuitry 321 of output driver 300 for a pull-down transition for output signal qout 111 may be replaced with other suitable circuitry for outputting a low output signal qout 111 in response to a control signal, such as control signals pu 105 and pd 108 for example.

For other embodiments, other suitable circuitry including similar devices, may be substituted for functionally similar circuitry or similar devices for the specific embodiments illustrated in the drawings.

Figure 5:
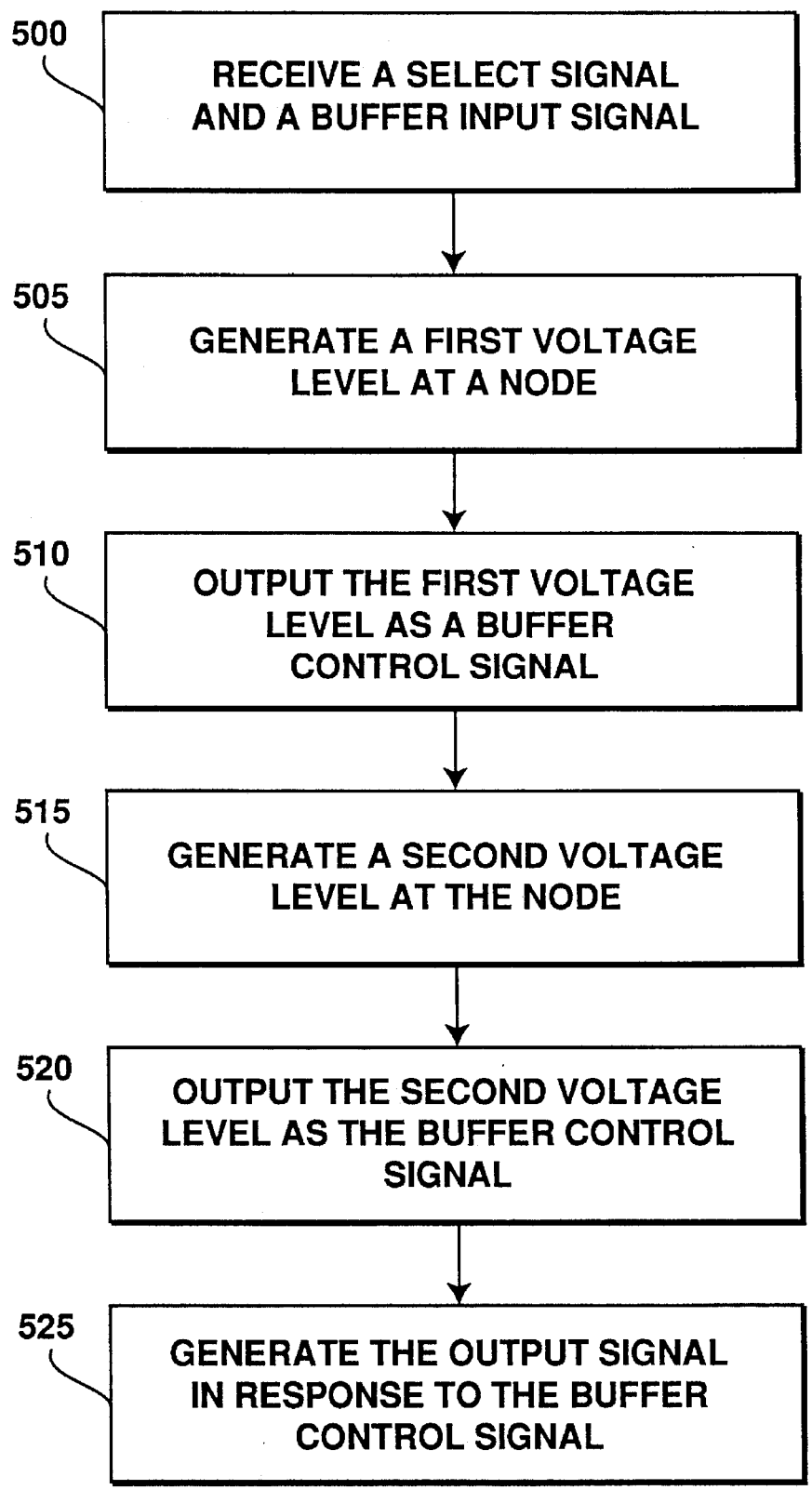
FIG. 5 illustrates, in flow diagram form, a method for generating an output signal for output buffer circuitry.

FIG. 5 illustrates, in flow diagram form, a method for generating an output signal for output buffer circuitry. The steps of FIG. 5 may be performed, for example, using circuitry for one embodiment for output buffer 100 of FIG. 1 where pull-up buffer 200 includes circuitry 200b of FIG. 4 and output driver 300 includes circuitry 301 of FIG. 3.

For step 500 of FIG. 5, a select signal and a buffer input signal are received. As illustrated in FIG. 4, for example, control signal select 103 or selb 107 and input signal gout 101 are received. Circuitry of output buffer 100 of FIG. 1 is selected in response to these signals for an output enable access of an output signal corresponding to input signal gout 101.

For step 505 of FIG. 5, a first voltage level is generated at a node. As illustrated in FIG. 4, for example, circuitry 401 of circuitry 200b couples voltage terminal V$_{CC}$ 414 to node 420. Transistor 408 couples voltage terminal V$_{CC}$ 414 to node 420 for a period of time as determined by the delay of the select signal by kickdly circuitry 404.

For step 510 of FIG. 5, the first voltage level at the node is output as a buffer control signal. As illustrated in FIG. 4, for example, the voltage level at node 420 is output as control signal pu 105 in response to control signal select 103 or selb 107 and in response to input signal gout 101.

For step 515 of FIG. 5, a second voltage level is generated at the node. As illustrated in FIG. 4, for example, circuitry 401 of circuitry 200b decouples voltage terminal V$_{CC}$ 414 from node 420 and couples input signal V$_{REG}$ 104 to node 420 in response to the delayed signal from kickdly circuitry 404 at node 406. Transistor 408 decouples voltage terminal V$_{CC}$ 414 from node 420 in response to the delayed signal at node 406. The delayed signal is inverted by inverter 416. Transistor 418 couples input signal V$_{REG}$ 104 to node 420 in response to this inverted signal.

For step 520 of FIG. 5, the second voltage level at the node is output as the buffer control signal. As illustrated in FIG. 4, for example, the second voltage level at node 420 is output as control signal pu 105 in response to control signal select 103 or selb 107 and in response to input signal gout 101.

For step 525 of FIG. 5, the output signal is generated in response to the buffer control signal. As illustrated in FIG. 3, for example, transistor 310 is responsive to control signal pu 105 for generating output signal qout 111. Transistor 310 is responsive to the first voltage level output as control signal pu 105 and is responsive to the second voltage level output as control signal pu 105 for generating output signal qout 111 in accordance with input signal gout 101.

In the foregoing description, the invention has been described with reference to specific embodiments thereof. It will, however, be evident that various modifications and changes may be made thereto without departing from the broader spirit or scope of the present invention as defined in the appended claims. The specification and drawings are, accordingly, to be regarded in an illustrative rather than a restrictive sense.

What is claimed is:

1. A method for generating an output signal for output buffer circuitry, comprising the steps of:

(a) generating a first voltage level at a node for a period of time;

(b) outputting the first voltage level at the node as a buffer control signal for the output buffer circuitry to generate an output signal corresponding to a logical state:

(c) generating a second voltage level at the node in response to a delayed control signal, wherein the second voltage level is different from the first voltage level;

(d) outputting the second voltage level at the node as the buffer control signal for the output buffer circuitry to generate the output signal corresponding to the logical state; and (e) generating the output signal corresponding to the logical state in response to the buffer control signal:

(f) receiving an input control signal; and (g) delaying the input control signal for the period of time to produce the delayed control signal.

2. The method of claim 1, wherein the generating step (e) includes the steps of:

(i) inputting the buffer control signal into a transistor; and (ii) coupling the output signal to a voltage terminal in response to the inputting step (e)(i).

3. The method of claim 2, wherein the input control signal is a select signal and wherein the method includes the step of selecting the output buffer circuitry for generating the output signal in response to the receiving step (f).

4. The method of claim 1, wherein the generating step (a) includes the step of coupling a first voltage terminal to the node; and wherein the generating step (c) includes the steps of:

(i) decoupling the first voltage terminal from the node in response to the delayed control signal, and (ii) coupling a second voltage signal to the node in response to the delayed control signal.

5. The method of claim 4, wherein the decoupling step (c)(i) includes the steps of:

(A) inputting the delayed control signal into a first transistor, and (B) decoupling the first voltage terminal from the node in response to the inputting step (c)(i)(A); and wherein the coupling step (c)(ii) includes the steps of:

(A) inputting the delayed control signal into an inverter to produce an inverted signal, (B) inputting the inverted signal into a second transistor, and (C) coupling the second voltage signal to the node in response to the inputting step (c)(ii)(B).

6. The method of claim 1, wherein the outputting step (b) includes the step of outputting the first voltage level at the node in response to the input control signal; and wherein the outputting step (d) includes the step of outputting the second voltage level at the node in response to the input control signal.

7. The method of claim 6, including the step of receiving a buffer input signal;

wherein the outputting step (b) includes the step of outputting the first voltage level at the node in response to the buffer input signal;

wherein the outputting step (d) includes the step of outputting the second voltage level at the node in response to the buffer input signal; and wherein the generating step (e) includes the step of generating the output signal in accordance with the buffer input signal.

8. An apparatus for generating an output signal, comprising:

a buffer control circuit generating a first voltage level at a node and generating a second voltage level at the node, wherein the second voltage level is different from the first voltage level, said buffer control circuit outputting the first voltage level at the node as a buffer control signal to generate an output signal corresponding to a logical state and outputting the second voltage level at the node as the buffer control signal to generate the output signal corresponding to the logical state;

an output generator coupled to the buffer control circuit, said output generator generating the output signal corresponding to the logical state in response to the buffer control signal; and a delay, coupled to the buffer control circuit and responsive to an input control signal, for delaying the input control signal for a period of time to produce a delayed control signal;

wherein the buffer control circuit generates the first voltage level at the node for the period of time; and wherein the buffer control circuit generates the second voltage level at the node in response to the delayed control signal.

9. The apparatus of claim 8, wherein the output generator comprises a transistor responsive to the buffer control signal for coupling the output signal to a voltage terminal.

10. The apparatus of claim 9, wherein the input control signal is a select signal and wherein the apparatus comprises select circuitry responsive to the select signal for selecting the apparatus for generating the output signal.

11. The apparatus of claim 8, wherein the buffer control circuit couples a first voltage terminal to the node to generate the first voltage level at the node; and wherein the buffer control circuit decouples the first voltage terminal from the node in response to the delayed control signal and couples a second voltage signal to the node in response to the delayed control signal to generate the second voltage level at the node.

12. The apparatus of claim 11, wherein the buffer control circuit includes:

a first transistor, coupled to the delay and responsive to the delayed control signal, for decoupling the first voltage terminal from the node, an inverter coupled to the delay for inverting the delayed control signal to produce an inverted signal, and a second transistor, coupled to the inverter and responsive to the inverted signal, for coupling the second voltage signal to the node.

13. The apparatus of claim 8, wherein the buffer control circuit is responsive to a buffer input signal, the buffer control circuit outputting the first voltage level at the node in response to the buffer input signal and outputting the second voltage level at the node in response to the buffer input signal; and wherein the output generator generates the output signal in accordance with the buffer input signal.

* * * * *